United States Patent
Yang

(10) Patent No.: US 7,652,347 B2
(45) Date of Patent: Jan. 26, 2010

(54) SEMICONDUCTOR PACKAGE HAVING EMBEDDED PASSIVE ELEMENTS AND METHOD FOR MANUFACTURING THE SAME

(75) Inventor: Seung Taek Yang, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 564 days.

(21) Appl. No.: 11/647,702

(22) Filed: Dec. 29, 2006

(65) Prior Publication Data
US 2008/0001285 A1 Jan. 3, 2008

(30) Foreign Application Priority Data
Jun. 29, 2006 (KR) .................. 10-2006-0059827

(51) Int. Cl.
H01L 23/58 (2006.01)
H01L 21/8222 (2006.01)

(52) U.S. Cl. .................. 257/528; 257/724; 257/774; 257/E21.004; 257/E21.008; 257/E21.022; 438/329

(58) Field of Classification Search .................. None
See application file for complete search history.

(56) References Cited

U.S. PATENT DOCUMENTS 7,084,009 B2 * 8/2006 Sunohara et al. ............ 438/112
2004/0113261 A1 * 6/2004 Sunohara et al. ............ 257/700
2004/0209399 A1 * 10/2004 Sunohara et al. ............ 438/108
2006/0158804 A1 * 7/2006 Usui et al. .................. 361/58

FOREIGN PATENT DOCUMENTS

JP 2004221176 A * 8/2004
KR 1020060063963 6/2006
KR 1020060069525 6/2006

* cited by examiner

Primary Examiner—Alonzo Chambliss
(74) Attorney, Agent, or Firm—Ladas & Parry LLP

(57) ABSTRACT

A semiconductor package includes a base substrate on which a semiconductor chip is placed so that a first surface thereof faces the base substrate. A circuit section is formed adjacent to the first surface. An insulation layer is formed on a second surface of the semiconductor chip which faces away from the first surface. Passive elements are formed on the insulation layer. Via patterns are formed to pass through the insulation layer and are connected to the passive elements. Via wirings are formed to pass through the semiconductor chip and connected to the circuit section, the via patterns and the base substrate. Outside connection terminals are attached to a first surface of the base substrate, which face away from a second surface of the base substrate on which the semiconductor chip is placed.

20 Claims, 6 Drawing Sheets

SEMICONDUCTOR PACKAGE HAVING EMBEDDED PASSIVE ELEMENTS AND METHOD FOR MANUFACTURING THE SAME

CROSS-REFERENCE TO RELATED APPLICATIONS

The present application claims priority to Korean patent application number 10-2006-0059827 filed on Jun. 29, 2006, which is incorporated herein by reference in its entirety.

BACKGROUND OF THE INVENTION

The present invention relates to a semiconductor package, and more particularly, to a semiconductor package in which passive elements are embedded, and a method for manufacturing the same.

In the semiconductor industry, a semiconductor package is a structure in which a semiconductor chip, having a fine circuit pattern designed therein, is molded by resin, ceramic, etc. so that the semiconductor chip can be protected from the surrounding environment and can be mounted to an electronic appliance. Rather than packaging a semiconductor chip in order to simply protect the semiconductor chip and then mounting the semiconductor chip to an electronic appliance, a semiconductor chip may be packaged in order to improve the performance and quality of an electronic appliance, and also to take advantage of the miniaturization and multi-functionality of the electronic appliance.

Semiconductor packaging technology has been continuously developed in order to meet the demands toward the miniaturization and multi-functionality of an electronic appliance. For example, the demand toward miniaturization is followed by the development of a chip-size package which has a size approaching the size of a chip, and the demand toward multi-functionality is followed by the development of a stack package in which a plurality of chips capable of performing various functions are stacked upon one another. The research for the chip-size package and the stack package have actively been conducted in a variety of ways in terms of structure and method.

However, in spite of efforts to decrease the size and the thickness of a semiconductor package to attain miniaturization of the semiconductor package, due to the presence of passive elements such as a resistor, an inductor and a capacitor, which are mounted along with the semiconductor package, limitations necessarily exist in decreasing the size and the thickness of the printed circuit board which is finally arranged in an electronic appliance, and this serves as a factor impeding the miniaturization and the slimness of the electronic appliance.

Also, due to the fact that the passive elements are mounted to the printed circuit board as in the conventional art, electrical connection lengths between the semiconductor package and the passive elements are long. As a consequence, since the inductance component increases, limitations exist in improving the electrical performance of the electronic appliance.

In addition, in the case of a wafer level package which is a kind of chip-size package, as the rear surface of a semiconductor chip is exposed to the outside, the semiconductor chip is likely to be damaged by an external shock and mis-operate, whereby it is difficult to ensure the reliability of an end product.

SUMMARY OF THE INVENTION

Embodiments of the present invention are directed to a semiconductor package, which eliminates the factors impeding the miniaturization and slimness of an electronic appliance, and a method for manufacturing the same.

Further, embodiments of the present invention are directed to a semiconductor package which minimizes electrical connection lengths between a semiconductor chip and passive elements, thereby improving the electrical performance of the electrical appliance, and a method for manufacturing the same.

Also, embodiments of the present invention are directed to a semiconductor package which can prevent damage to a semiconductor chip, even having a wafer level package structure, and a method for manufacturing the same.

In one embodiment, a semiconductor package may comprise a base substrate; a semiconductor chip placed on the base substrate so that a first surface of the semiconductor chip faces the base substrate, and the semiconductor chip having a circuit section which is formed adjacent to the first surface; an insulation layer formed on a second surface of the semiconductor chip which faces away from the first surface; at least one passive element formed on the insulation layer; via patterns formed to pass through the insulation layer, and connected to the passive elements; via wirings formed to pass through the semiconductor chip and connected to the circuit section, the via patterns and the base substrate; and outside connection terminals attached to a first surface of the base substrate which faces away from a second surface of the base substrate on which the semiconductor chip is placed.

The insulation layer, the at least one passive element, and the via patterns are formed to constitute multiple layers.

The at least one passive element includes a resistor, an inductor and a capacitor.

The via wirings are formed to project beyond the first surface of the semiconductor chip.

The outside connection terminals comprise solder balls.

At least two semiconductor chip units, each semiconductor chip unit including the semiconductor chip, the insulation layer, the via patterns, the passive elements and the via wirings, are stacked upon each other, and the stacked semiconductor chip units are electrically connected with each other by contact between the via patterns of a lower semiconductor chip and the via wirings of an upper semiconductor chip.

The semiconductor package may further comprise a protective layer formed on the insulation layer to protect the at least one passive element, and the protective layer may have holes which expose the via patterns.

In another embodiment, a method for manufacturing a semiconductor package may comprise forming an insulation layer on a second surface of a semiconductor chip which faces away from a first surface of the semiconductor chip which is adjacent to where a circuit section is formed; forming passive elements on the insulation layer and forming via patterns which pass through the insulation layer and are connected to the passive elements; forming via wirings which pass through the semiconductor chip and are connected to the via patterns; mounting the semiconductor chip to a base substrate such that the first surface of the semiconductor chip faces the base substrate, the semiconductor chip having the at least one passive element and the insulation layer formed on the second surface of the semiconductor chip; and attaching outside connection terminals on a second surface of the base substrate which faces away from a first surface of the base substrate on which the semiconductor chip is mounted.

The step of the insulation layer on the second surface of the semiconductor chip may be implemented with a protective film formed on the first surface of the semiconductor chip.

The steps of forming the insulation layer, forming the at least one passive element, forming the via patterns, and forming the via wiring are implemented at least two times.

The steps of forming the insulation layer, forming the at least one passive element, forming the via patterns, and forming the via wiring are implemented at a wafer level.

The passive elements include a resistor, an inductor and a capacitor.

The method may further comprise, the step of: forming a protective layer on the insulation layer which has the at least one passive element and the via patterns formed thereon and therethrough.

The protective layer may be formed to have holes which expose the via patterns.

The method may further comprise, the step of: stacking at least two semiconductor chip units, each including the insulation layer, the via patterns, the passive elements, the via wirings and the semiconductor chip. The stacking step may be implemented at a wafer level. The stacking step may be implemented in a manner such that the semiconductor chip units are electrically connected with each other through the via patterns and the via wirings.

The outside connection terminals are formed as solder balls.

DESCRIPTION OF SPECIFIC EMBODIMENTS

A preferred embodiment of the present invention is directed to a semiconductor package in which passive elements, including a resistor, an inductor, and a capacitor, are embedded. That is to say, in an embodiment of the present invention, by forming the passive elements, including a resistor, an inductor and a capacitor, on the rear surface of a semiconductor chip, a semiconductor chip unit is configured, and by mounting the semiconductor chip unit to a base substrate, a semiconductor package is configured.

Therefore, in an embodiment of the present invention, since the passive elements are installed on the rear surface of the semiconductor chip, in a printed circuit board, a separate area for mounting the passive elements is not required. Accordingly, in the semiconductor package according to an embodiment of the present invention, through the miniaturization of the package, the miniaturization and slimming of an electronic appliance can be attained.

Also, the semiconductor package according to an embodiment of the present invention has a structure in which the passive elements are embedded in the semiconductor package, the electrical connection lengths between a semiconductor chip and the passive elements are shortened, and thereby, the electrical performance of the electronic appliance may be improved.

In addition, in the semiconductor package according to an embodiment of the present invention, since the passive elements are formed on the rear surface of a semiconductor chip, it is possible to prevent the rear surface of the semiconductor chip from being exposed to the outside due to the presence of the passive elements. As a consequence, it is possible to prevent the semiconductor chip from being damaged by an external shock, and the mis-operation of the semiconductor chip.

Hereafter, a semiconductor package in accordance with an embodiment of the present invention and a method for manufacturing the same will be described with reference to the attached drawings.

Figure 1:
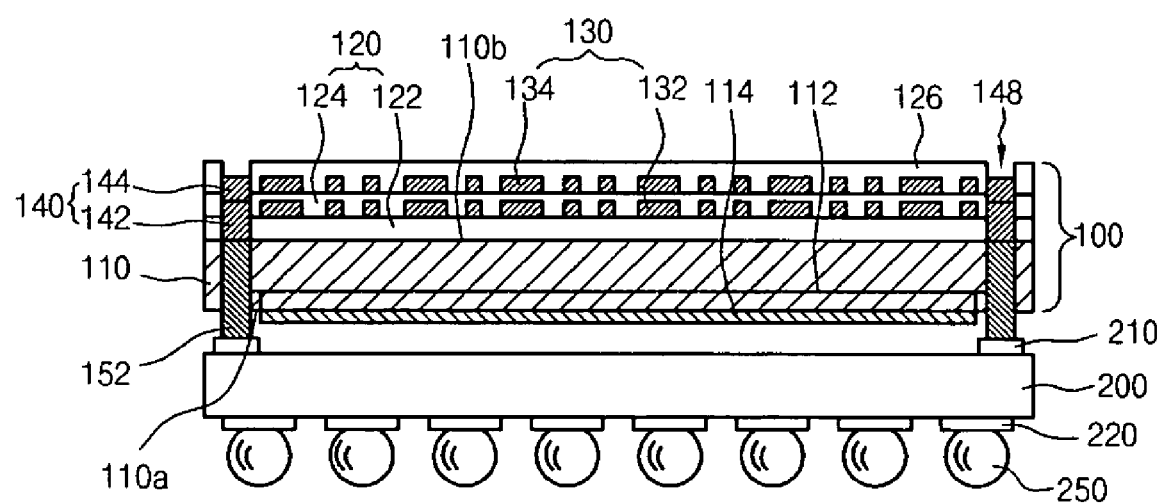
FIG. 1 is a cross-sectional view illustrating a semiconductor package in accordance with one embodiment of the present invention.

FIG. 1 is a cross-sectional view illustrating a semiconductor package in accordance with an embodiment of the present invention. Referring to FIG. 1, a semiconductor package 300 according to the present invention includes a base substrate 200, a semiconductor chip unit 100 mounted to the base substrate 200, and outside connection terminals 250 attached to the lower surface of the base substrate 200.

The semiconductor chip unit 100 is prepared at a wafer level so that a plurality of semiconductor chips 110 are arranged in a plurality of rows and columns. The semiconductor chip unit 100 includes a semiconductor chip 110, an insulation layer 120, passive elements 130, via patterns 140, and via wirings 152.

The semiconductor chip 110 has a quadrangular shape when viewed from the top. The semiconductor chip 110 includes a circuit section 112 which is formed therein adjacent to the first surface, that is, the upper surface 110a thereof, and a connection wiring 114 which is formed on the upper surface 111a to be connected with the circuit section 112.

The insulation layer 120, the passive elements 130 and the via patterns 140 are formed on the second surface, that is, the lower surface 110b, of the semiconductor chip 110. The insulation layer 120 is composed of a first insulation layer 122 and a second insulation layer 124. The passive elements 130 are formed on the first and second insulation layers 122 and 124. The first insulation layer 122 is formed to be brought into contact with the lower surface 110b of the semiconductor chip 110, and functions to cover and insulate the entire lower surface 110b of the semiconductor chip 110. The second insulation layer 124 is formed on the first insulation layer 122 on which first passive elements 132 are formed. The second insulation layer 124 functions to insulate the second passive elements 134, formed on the second insulation layer 124, from the first passive elements 132, and serves as a dielectric for a capacitor among the passive elements, which accumulates charges. The second insulation layer 124 is formed using the same material as the first insulation layer 122.

The passive elements 130 are electric elements which include a resistor, an inductor and a capacitor. The passive elements 130 are formed on the first and second insulation layers 122 and 124 as metal wirings having various patterns to define a double-layered structure. At this time, the respective first and second passive elements 132 and 134 formed on the first and second insulation layers 122 and 124 are made of metal which have an excellent electric conductivity.

The passive elements 130 include a resistor, an inductor and a capacitor which define an electronic circuit in cooperation with an active element such as the semiconductor package 300, and are necessarily needed to control the active element. The basic elements of the passive elements are a resistor which functions to restrain current flow or distribute a voltage and generate a potential difference, an inductor which adjusts current flow depending upon a frequency, and a capacitor which has a characteristic opposite from that of the inductor and accumulates charges. Here, the inductor has a characteristic which restrains current flow as frequency increases, and the capacitor has a characteristic which allows current flow as frequency increases.

The via patterns 140 are formed in the first and second insulation layers 122 and 124. The via patterns 140 are formed at positions which correspond to the peripheral portions of the semiconductor chip 110, to substantially pass through the first and second insulation layers 122 and 124. In particular, the first via patterns 142 formed in the first insulation layer 122 are formed to be connected with the first passive elements 132 formed on the first insulation layer 122, and the second via patterns 144 formed in the second insulation layer 124 are formed to be connected with the second passive elements 134 formed on the second insulation layer 124. The first and second via patterns 142 and 144 are formed to be positioned up and down and to be connected with each other in the first and second insulation layers 122 and 124. Specifically, the first via patterns 142 are formed to project out of the first insulation layer 122 by an amount which corresponds to the height of the first passive elements 132.

The first via patterns 142 are formed together with the first passive elements 132, and the second via patterns 144 are formed together with the second passive elements 134. Similar to the first and second passive elements 132 and 134, the first and second via patterns 142 and 144 are formed of metal having excellent electric conductivity. The first and second via patterns 142 and 144 are formed in the shape of thin layers on the inner walls of via holes, or completely fill the via holes.

Meanwhile, a protective layer 126 is formed on the second insulation layer 124 on which the second passive elements 134 are formed, to protect the second passive elements 134 and the semiconductor chip unit 100 from an external shock or the surrounding environment. At this time, holes 148 for exposing the second via patterns 144 are defined through the portions of the protective layer 126 which correspond to the second via patterns 144.

The via wirings 152 are formed at the peripheral portions of the semiconductor chip 110 which correspond to the first via patterns 142. The via wirings 152 are formed the project higher than the connection wiring 114 which is formed on the upper surface 110*a* of the semiconductor chip 110. The via wirings 152 are formed to be connected with the circuit section 112 of the semiconductor chip 110 and the connection wiring 114, and electrically communicate the circuit section 112 with the passive elements 130. Each of the via wirings 152 which function in this way comprises a through-hole 151 which passes from the first surface 110*a* to the second surface 110*b* of the semiconductor chip 110, and a conductive layer (see FIG. 2G) which fills the through-hole 151 and is formed to project higher than the connection wiring 114. The via wirings 152 are formed in the shape of thin layers on the inner walls of the through-holes 151 or to completely fill the through-holes 151.

The base substrate 200 serves as a member to which the semiconductor chip unit 100 is mounted. The base substrate 200 has electrode pads 210 on the upper surface thereof which faces the upper surface 110*a* of the semiconductor chip 110, and ball lands 220 on the lower surface thereof which is opposite the upper surface. The base substrate 200 further has via circuits (not shown) formed therein through which the electrode pads 210 and the ball lands 220 are electrically connected with each other. The electrode pads 210 are positioned on the peripheral portions of the base substrate 200 which correspond to the via wirings 152. Accordingly, the base substrate 200 and the semiconductor chip 110 are electrically connected with each other through electrical connection between the electrode pads 210 and the via wirings 152.

The outside connection terminals 250 serve as means for mounting and electrically connecting the semiconductor package 300 to outside circuits. The outside connection terminals 250 are attached to the ball lands 220 which are provided to the lower surface of the base substrate 200. Preferably, the outside connection terminals 250 comprise solder balls.

Figure 3:
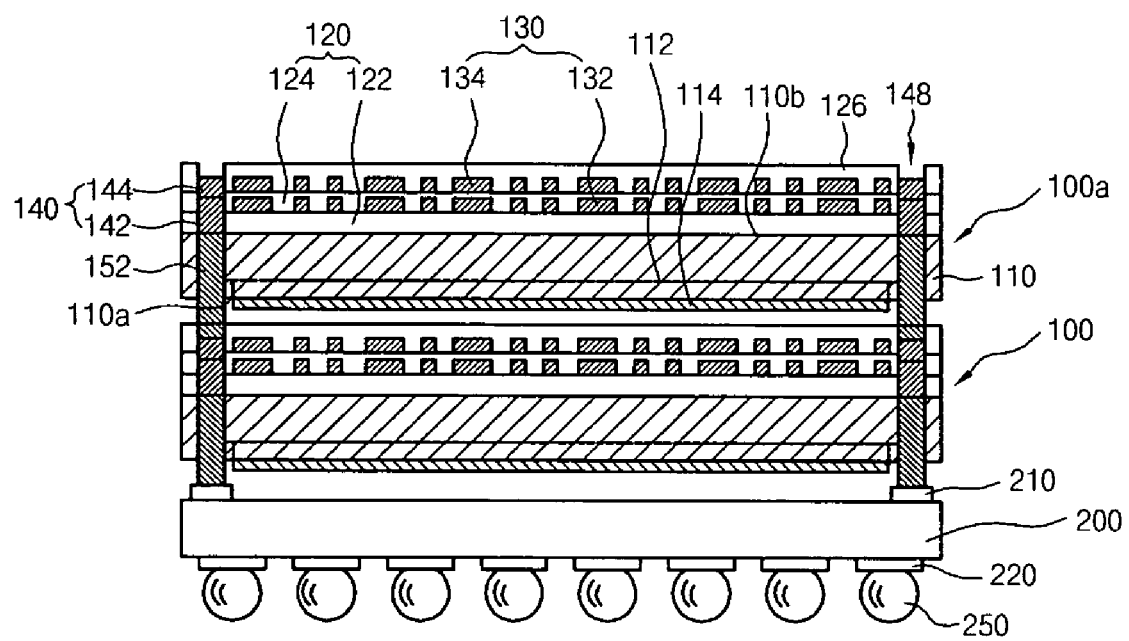
FIG. 3 is a cross-sectional view illustrating a semiconductor package in accordance with another embodiment of the present invention.

FIG. 3 is a cross-sectional view illustrating a semiconductor package 400 in accordance with another embodiment of the present invention, in which two semiconductor chip units are stacked upon each other. Referring to FIG. 3, two semiconductor chip units 100 and 100*a* are stacked on the base substrate 200. Each of the semiconductor chip units 100 and 100*a* are constructed in the same manner as described above.

Therefore, in the present invention, by stacking at least two semiconductor chip units 100, it is possible to realize the semiconductor package 400 which has a stacked structure. At this time, the stacked semiconductor chip units 100 are electrically connected with each other by the via patterns 140 and the via wirings 152.

In the semiconductor package according to an embodiment of the present invention, constructed as mentioned above, since passive elements including a resistor, an inductor and a capacitor are formed on the rear surface of a semiconductor chip, it is not necessary to separately mount passive elements. Therefore, in the present invention, the size and the thickness of a printed circuit board can be decreased, and it is possible to mount an increased number of semiconductor packages to a printed circuit board.

Also, in an embodiment of the present invention, since the passive elements are formed on the rear surface of the semiconductor chip, it is not necessary to form contact pads, via holes, etc. on a printed circuit board, to which the passive elements are connected, and the manufacturing cost of the printed circuit board can be decreased.

In addition, in an embodiment of the present invention, since the passive elements are formed on the rear surface of the semiconductor chip, the connection lengths between the passive elements and an active element can be shortened, and it is possible to have an electric/electronic appliance having improved electrical functionality.

Hereafter, a method for manufacturing the semiconductor package in accordance with an embodiment of the present invention will be described with reference to FIGS. 2A through 2H.

Figure 2A:
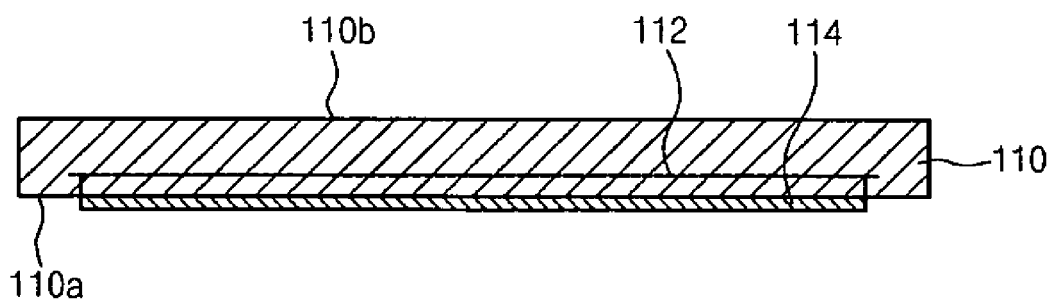
FIGS. 2A through 2H are cross-sectional views illustrating the process steps of a method for manufacturing the semiconductor package in accordance with an embodiment of the present invention.

Referring to FIG. 2A, semiconductor chips 110 each having a circuit section 112 and a connection wiring 114 are formed on a wafer which has a circular shape when viewed from the top. The circuit section 112 and the connection wiring 114 are formed on the first surface, that is, the upper surface 110*a*, of the semiconductor chip 110. In order to decrease the thickness of the semiconductor chip 110, the second surface, that is, the lower surface 110*b*, of the semiconductor chip 110, which is opposite the upper surface 110*a*, has material removed to achieve a predetermined thickness.

Figure 2B:
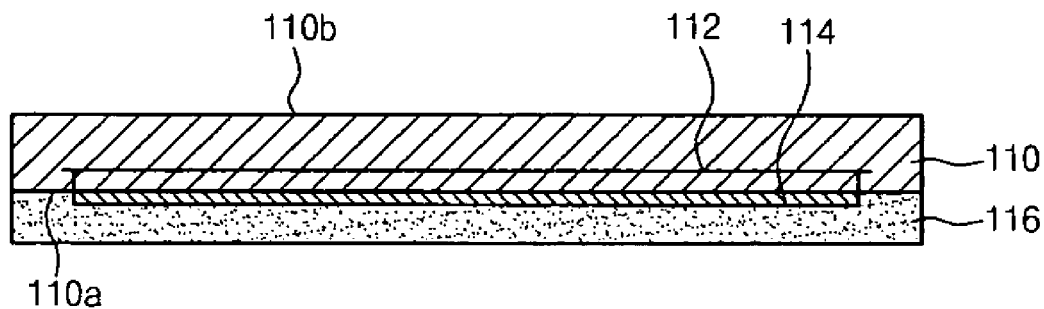

Referring to FIG. 2B, a protective film 116 is formed on the upper surface 110*a* of the semiconductor chip 110 by applying a substance capable of being stripped. The protective film 116 serves to protect the circuit section 112 and the connection wiring 114 against damage during subsequent processes. Preferably, the protective film 116 comprises a photoresist.

Figure 2C:
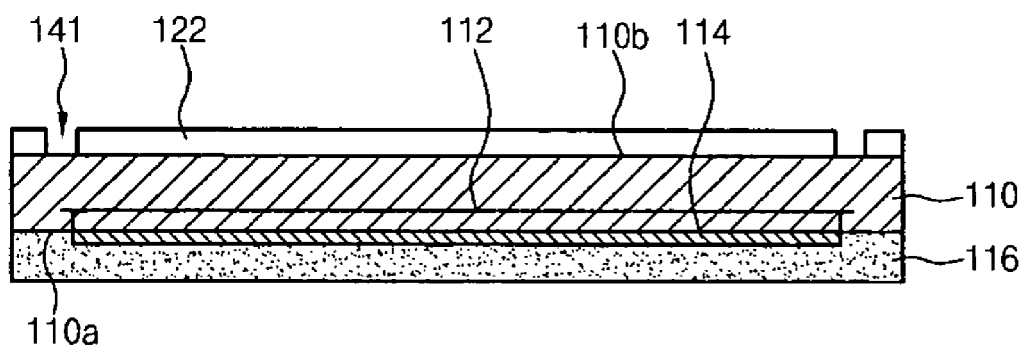

Referring to FIG. 2C, with the protective film 116 formed on the upper surface 110*a* of the semiconductor chip 110, a first insulation layer 122 is formed on the lower surface 110b of the semiconductor chip 110. By etching the fist insulation layer 122, first via holes 141 are defined to pass through the first insulation layer 122. The via holes 141 are defined to be located on the peripheral portions of the lower surface 110b of the semiconductor chip 110.

Figure 2D:
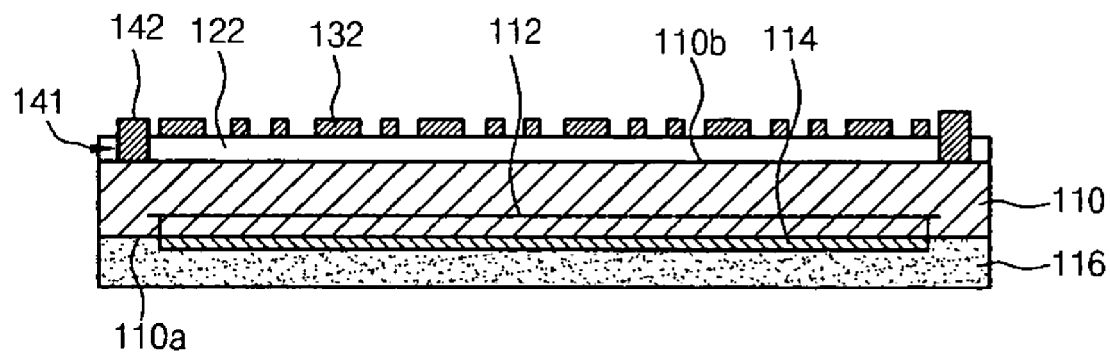

Referring to FIG. 2D, a conductive layer is deposited on the first insulation layer 122. At this time, the first via holes 141 are filled by the conductive layer. By etching the conductive layer, first passive elements 132 including a resistor, an inductor and a capacitor are formed on the first insulation layer 122, and first via patterns 142 are formed in the first via holes 141. At this time, the first via patterns 142 are formed to project out of the first insulation layer 122 by an amount which corresponds to the height of the first passive elements 132.

Figure 2E:
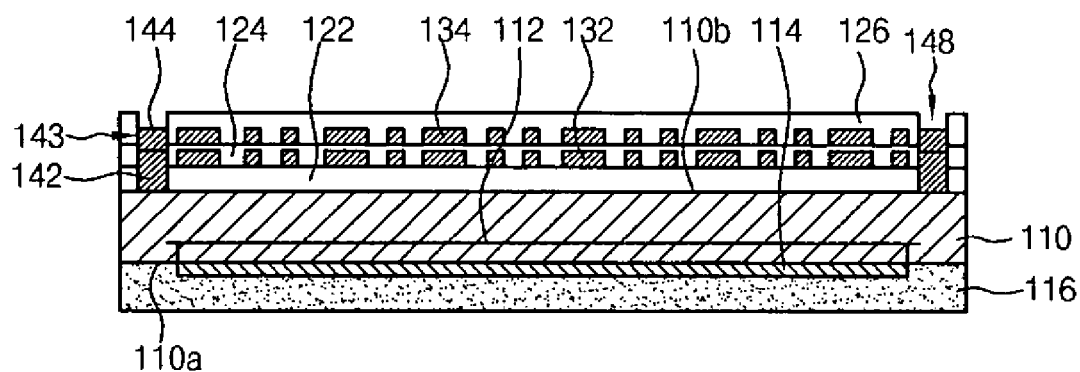

Referring to FIG. 2E, a second insulation layer 124 is formed on the first insulation layer 122 to cover the first passive elements 132 and the first via patterns 142. By etching the second insulation layer 124, second via holes which expose the first via patterns 142 are formed on the peripheral portions of the second insulation layer 124 which correspond to the first via patterns 142. After depositing a conductive layer on the second insulation layer 124 including the second via holes, by etching the conductive layer, second passive elements 134 including a resistor, an inductor and a capacitor are formed on the second insulation layer 124, and second via patterns 144 are formed in the second via holes. The second via patterns 144 are formed to be electrically connected with the first via patterns 142 and project out of the second insulation layer 124 by an amount which corresponds to the height of the second passive elements 132.

In order to protect the second passive elements 134 and the semiconductor chip unit 100 from an external shock or the surrounding environment, a protective layer 126 is formed on the second insulation layer 124 to cover the second passive elements 134. Then, holes 148 which expose the second via patterns 144 are defined in the portions of the protective layer 126 which correspond to the second via patterns 144.

Here, the first insulation layer 122, the second insulation layer 124 and the protective layer 126 are formed of the same material. Preferably, the thickness of the semiconductor chip 110, the rear surface 110b of which is partially removed, preferably by grinding, corresponds to the thickness which is obtained by adding the thicknesses of the first insulation layer 122, the second insulation layer 124 and the protective layer 126.

Figure 2F:
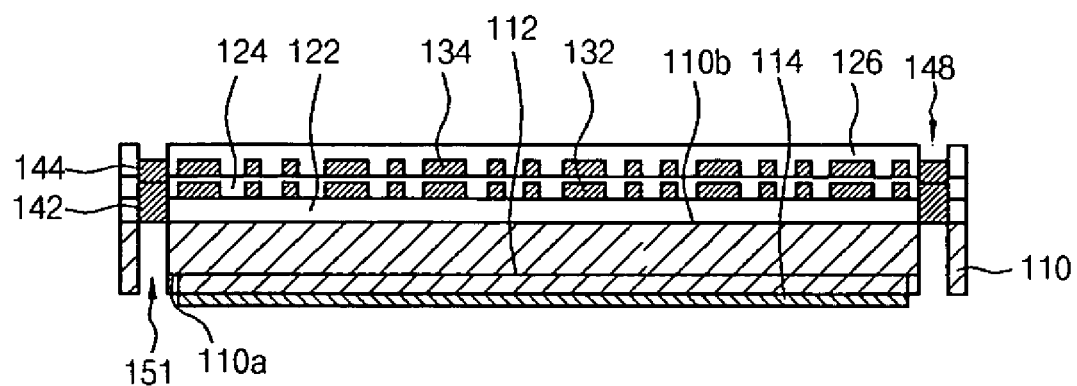

Referring in FIG. 2F, the protective film 116 formed on the upper surface 110a of the semiconductor chip 110 is removed. By etching semiconductor chip 110, or by irradiating semiconductor chip 110 with a laser, through-holes 151 are defined in the portions of the semiconductor chip 110 which correspond to the first via patterns 142, to pass from the upper surface 110a to the lower surface 110b of the semiconductor chip 110.

Figure 2G:
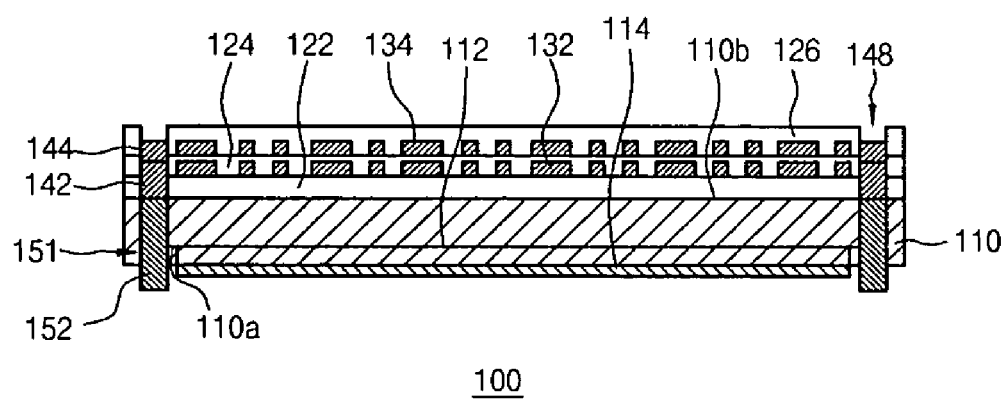

Referring to FIG. 2G, by filling in the through-holes 151 with a conductive layer, wirings 152 are formed, and through this, a semiconductor chip unit 100 is completed. Here, the via wirings 152 are formed to be electrically connected with the first via patterns 142 and with the circuit section 112 in the semiconductor chip 110.

Preferably, the via wirings 152 are formed, to fill the through-holes 151, by a plating process, and project higher than the connection wiring 114 which is formed on the upper surface 110a of the semiconductor chip 110. In the case of stacking semiconductor chip units 100 and 100a as shown in FIG. 3, the via wirings 152, which project as described above, are inserted into the holes 148 of the protective layer 126, which are defined in the lower semiconductor chip 100, to be electrically connected with the second via patterns 144.

Figure 2H:
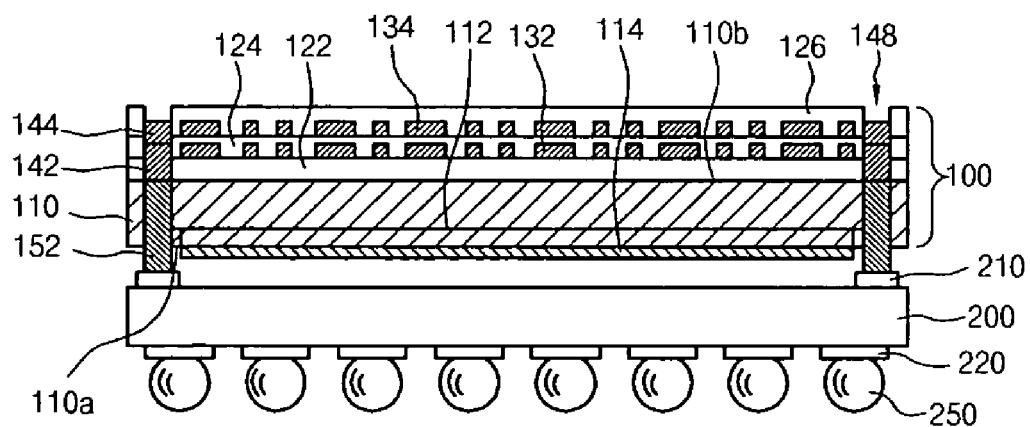

Referring to FIG. 2H, by conducting a cutting process for the plurality of semiconductor chip units 100 which are formed at a wafer level, individual semiconductor chip units 100 are obtained. Thereupon, the semiconductor chip unit 100 obtained in this way is mounted to a base substrate 200 which has electrode pads 210 on the upper surface thereof, ball lands 220 on the lower surface thereof, and via circuits (not shown) formed therein to connect the electrode pads 210 and the ball lands 220 with each other. At this time, the electrode pads 210 are located on portions of the base substrate 200 which correspond to the via wirings 152 of the semiconductor chip unit 100, and as a result, the semiconductor chip unit 100 and the base substrate 200 are electrically connected with each other through the electrical connection between the via wirings 152 and the electrode pads 210. Outside connection terminals 250 such as solder balls are attached to the ball lands 220 of the base substrate 200 to serve as mounting means to outside circuits. As a consequence, a semiconductor chip package 300 according to an embodiment of the present invention is completed.

FIG. 3 is a cross-sectional view illustrating a semiconductor package 400 in accordance with another embodiment of the present invention, in which two semiconductor chip units are stacked upon each other. Referring to FIG. 3, in the present invention, at least two semiconductor chip units 100 and 100a can be stacked to realize the semiconductor package 400 which has a stacked structure. At this time, as described above, the stacked semiconductor chip units 100 which are positioned up and down are electrically connected with each other due to the fact that the projecting via wirings 152 of the semiconductor chip unit 100a are positioned upward and are inserted into the holes 148 which are defined in the protective layer 128 of the semiconductor chip unit 100 which is positioned lower.

Meanwhile, the semiconductor package having the stacked structure as described above may be configured in a manner such that, after first stacking the semiconductor chip units 100 and 100a upon each other, the stacked semiconductor chip units 100 and 100a are mounted to the base substrate 200. At this time, the stacking of the semiconductor chip units 100 and 100a is implemented at a wafer level.

As is apparent from the above description, in an embodiment of the present invention, since passive elements including a resistor, an inductor and a capacitor are formed on the rear surface of a semiconductor chip, it is not necessary to separately mount passive elements on a printed circuit board. Therefore, the size and thickness of the printed circuit board can be decreased, and it is possible to mount an increased number of semiconductor packages on a printed circuit board. Also, in an embodiment of the present invention, because the passive elements are formed on the rear surface of the semiconductor chip, connection lengths between an active element and a passive element can be shortened, and it is possible to realize an electric/electronic appliance having improved electrical performance. In addition, in the present invention, because the rear surface of the semiconductor chip is protected by a protective layer, the reliability of an end product can be improved.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a base substrate;
   a semiconductor chip placed on the base substrate so that a first surface of the semiconductor chip faces the base substrate, and the semiconductor chip having a circuit section which is formed adjacent to the first surface;
   an insulation layer formed on a second surface of the semiconductor chip which faces away from the first surface;
   at least one passive element formed on the insulation layer;
   via patterns formed to pass through the insulation layer, and connected to the passive elements;
   via wirings formed to pass through the semiconductor chip and connected to the circuit section, the via patterns and the base substrate; and
   outside connection terminals attached to a first surface of the base substrate which faces away from a second surface of the base substrate on which the semiconductor chip is placed.

2. The semiconductor package according to claim 1, wherein the insulation layer, the at least one passive element, and the via patterns are formed to constitute multiple layers.

3. The semiconductor package according to claim 1, wherein the at least one passive element includes a resistor, an inductor and a capacitor.

4. The semiconductor package according to claim 1, further comprising:
   a protective layer formed on the insulation layer to protect the at least one passive element.

5. The semiconductor package according to claim 4, wherein the protective layer has holes which expose the via patterns.

6. The semiconductor package according to claim 1, wherein the via wirings are formed to project beyond the first surface of the semiconductor chip.

7. The semiconductor package according to claim 1, wherein at least two semiconductor chip units are stacked upon each other, each semiconductor chip unit including the semiconductor chip, the insulation layer, the via patterns, the least one passive element and the via wirings.

8. The semiconductor package according to claim 7, wherein the stacked semiconductor chip units are electrically connected with each other by contact between via patterns of a lower semiconductor chip and via wirings of an upper semiconductor chip.

9. The semiconductor package according to claim 1, wherein the outside connection terminals comprise solder balls.

10. A method for manufacturing a semiconductor package, comprising the steps of:
    forming an insulation layer on a second surface of a semiconductor chip which faces away from a first surface of the semiconductor chip which is adjacent to where a circuit section is formed;
    forming at least one passive element on the insulation layer and forming via patterns which pass through the insulation layer and are connected to the at least one passive element;
    forming via wirings which pass through the semiconductor chip and are connected to the via patterns;
    mounting the semiconductor chip to a base substrate such that the first surface of the semiconductor chip faces the base substrate, the semiconductor chip having the at least one passive element and the insulation layer formed on the second surface of the semiconductor chip; and
    attaching outside connection terminals on a second surface of the base substrate which faces away from a first surface of the base substrate on which the semiconductor chip is mounted.

11. The method according to claim 10, wherein the step of the insulation layer on the second surface of the semiconductor chip is implemented with a protective film formed on the first surface of the semiconductor chip.

12. The method according to claim 10, wherein the steps of forming the insulation layer, forming the at least one passive element, forming the via patterns, and forming the via wirings are implemented at least two times.

13. The method according to claim 10, wherein the steps of forming the insulation layer, forming the at least one passive element, forming the via patterns, and forming the via wirings are implemented at a wafer level.

14. The method according to claim 10, wherein the at least one passive element includes a resistor, an inductor and a capacitor.

15. The method according to claim 10, further comprising the step of:
    forming a protective layer on the insulation layer which has the at least one passive element and the via patterns formed thereon and therethrough.

16. The method according to claim 15, wherein the protective layer is formed to have holes which expose the via patterns.

17. The method according to claim 10, further comprising, the step of:
    stacking at least two semiconductor chip units, each including the insulation layer, the via patterns, the passive elements, the via wirings and the semiconductor chip.

18. The method according to claim 17, wherein the stacking step is implemented at a wafer level.

19. The method according to claim 17, wherein the stacking step is implemented in a manner such that the semiconductor chip units are electrically connected with each other through the via patterns and the via wirings.

20. The method according to claim 10, wherein the outside connection terminals are formed as solder balls.

* * * * *